United States Patent [19]
Gasser et al.

[11] 4,015,190
[45] Mar. 29, 1977

[54] CONTROLLABLE NEGATIVE RESISTANCE ELECTRONIC SWITCH ARRANGEMENT

[75] Inventors: Lorenz Gasser, Stuttgart-Mohringen; Kalman Széchényi, Stuttgart, both of Germany

[73] Assignee: International Standard Electric Corporation, New York, N.Y.

[22] Filed: Apr. 16, 1975

[21] Appl. No.: 568,547

[30] Foreign Application Priority Data
Apr. 22, 1974 Germany .......................... 2419357

[52] U.S. Cl. ................................ 323/4; 178/69 R; 179/18 GF; 323/66
[51] Int. Cl.² ........................................ G05F 1/40
[58] Field of Search ................ 323/1, 4, 9, 17, 19, 323/63, 64, 65, 66; 178/69 R, 69 N, 69 C, 69 E, 69 G; 179/18 GF

[56] References Cited
UNITED STATES PATENTS

| | | | |
|---|---|---|---|
| 2,401,343 | 6/1946 | Erickson | 178/69 E |
| 3,742,330 | 6/1973 | Hodges et al. | 323/4 |
| 3,881,066 | 4/1975 | Macrander | 179/18 GF |

*Primary Examiner*—Gerald Goldberg
*Attorney, Agent, or Firm*—John T. O'Halloran; Thomas M. Marshall; Peter C. Van Der Sluys

[57] ABSTRACT

An electronic switch arrangement reverses damping of an electronic switching element by means of a controllable negative resistance. Adjustment of the negative resistance is provided by comparing a measuring current through the arrangement to a preselected reverse current.

6 Claims, 5 Drawing Figures

4,015,190

CONTROLLABLE NEGATIVE RESISTANCE ELECTRONIC SWITCH ARRANGEMENT

FIELD OF THE INVENTION

The present invention relates to a circuit arrangement for reversing the damping of electronic switches with linear current-voltage characteristics, such as the switching elements of a telephone exchange.

BACKGROUND OF THE INVENTION

In conventional telephone switching systems the subscribers are interconnected, inter alia, by the metal contacts of the switching grid. However, the replacement of these metal contacts by electronic switches, made possible by the progressive development of the technology of these components and by the cost reduction involved, poses problems which are mainly associated with the comparatively complicated transmission characteristics of an electronic switch. In particular, these switches have a higher resultant resistance than corresponding metal contacts, which is disadvantageous especially in multistage switching grids.

Suitable electronic switches are, for example, MOS transistors operated in the linear portion of their current-voltage characteristics.

SUMMARY OF THE INVENTION

It is, therefore, an object of the present invention to reverse the damping of electronic switches. The invention is characterized in that the electronic switch, a controllable negative resistance, a series resistor, and a dc voltage source, in this order, are connected in series and form a circuit such that the useful current to be transmitted is coupled into and out of the circuit on both sides of the electronic switch. The series resistor and the dc voltage source are shunted by a capacitor to allow the flow of alternating current, and a comparator circuit measures the voltage drop across the dc voltage source and across the series resistor and passes it on to a controller which adjusts the negative resistance so that the voltage drop disappears.

The advantages of this circuit arrangement lie in the fact that no nominal value is needed to control the negative resistance, and that, if a plurality of electronic switches are used, e.g. in the switching grid of a telephone switching exchange, tolerances of the switches among one another do not affect the accuracy of control.

The invention will now be explained with reference to the accompanying drawings, in which the principle according to the invention is used to automatically reverse the damping of a switching grid of a telephone exchange.

DESCRIPTION OF THE PREFERRED EMBODIMENT

Figure 1:
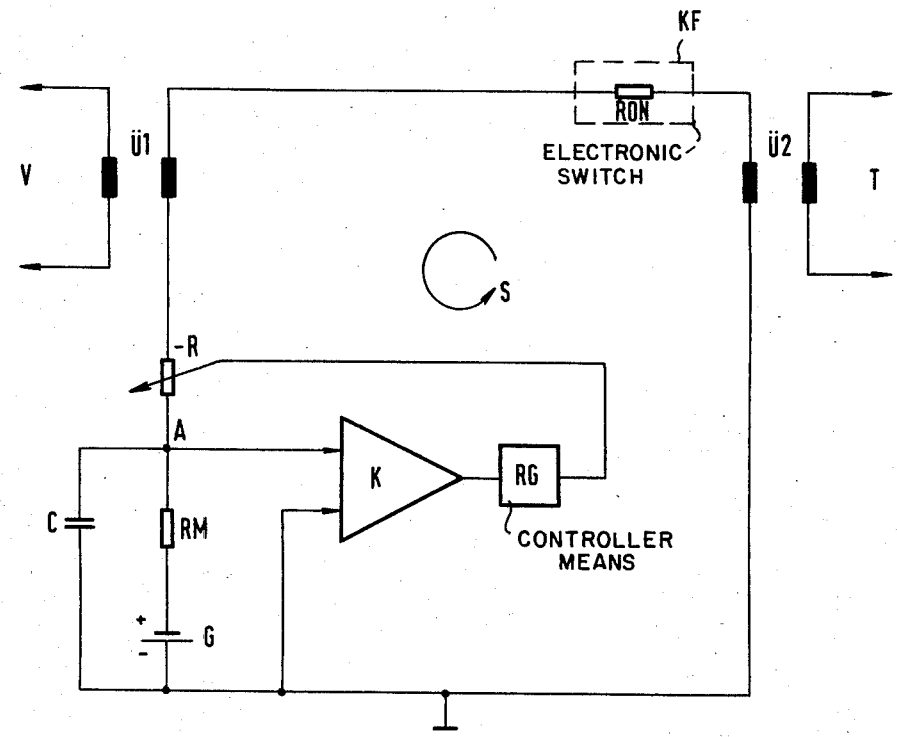
FIG. 1 is a schematic representation of a circuit arrangement for reversing the damping of a switching element in an exchange with an unsymmetrical switching grid.

The circuit arrangement of FIG. 1 shows, in place of the switching grid KF, one electronic switch RON, which is used here as a switching element. The useful current flowing through this switching element is coupled via transformers Ü1 and Ü2, associated with input V and output T. It sees the total resistance $$R_N = RON + (-R), \quad (1)$$

where $-R$ is the negative resistance used to reverse the damping. A resistor RM included in the circuit does not contribute to the total resistance $R_N$ because it is short-circuited by a capacitor C for the flow of alternating current.

A dc voltage source G feeds a measuring current IM into the arrangement. This current sees a resistance $$R_M = RM + RON + (-R). \quad (2)$$

To reverse the damping of the electronic switch RON it is required that $$RN = RON + (-R) \stackrel{!}{=} 0. \quad (1a)$$

Substituting (1a) into (2) yields $$R_M \stackrel{!}{=} RM,$$

i.e., the condition (1a) is satisfied if the voltage UM of the dc voltage source G drops across the series resistor RM or, in other words, if the potential at the point A disappears. This requirement can be met with a minimum of circuitry. The potential of the point A and the zero potential are applied to a comparator circuit K, i.e., this comparator circuit K measures the voltage drop across the dc voltage source G and across the series resistor RM. The comparator circuit K via a controller RG causes the negative resistance $-R$ to be adjusted so that this voltage drop disappears so that the damping of the switching element RON has been reversed.

Figure 4:
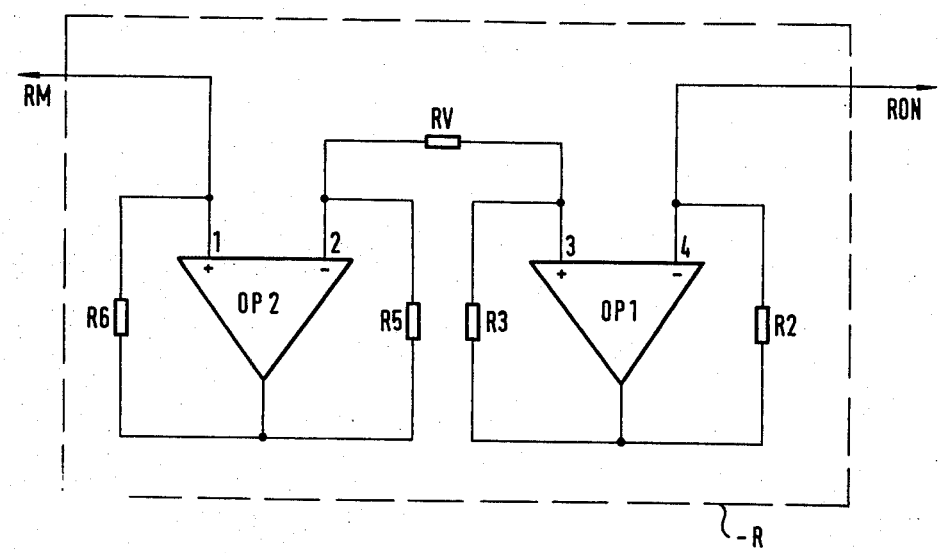
FIG. 4 is a schematic representation of the negative resistance $-R$ of FIG. 1.

FIG. 4 shows a negative resistance $-R$ which can be used in such an arrangement. It consists of two operational amplifiers OP1 and OP2 employing negative feedback via feedback resistors R2, R3, R5 and R6 and interconnected via a resistor RV, and has a negative resistance with respect to the side facing the switching element RON and a positive resistance with respect to the side facing the resistor RM.

The circuit arrangement of FIG. 2 consists of two like circuits S, each of which is constructed as explained with reference to FIG. 1. This circuit arrangement is especially suited for use in telephone switching systems with symmetrical speech paths. A common dc voltage source G' feeds the two circuits, and a common capacitor C' bypasses the resistors RM1 and RM2.

As explained above, the negative resistances $-R_1$ and $-R_2$ are adjusted independently of each other via comparator circuits K1 and K2 and controllers RG1 and RG2.

Figure 2:
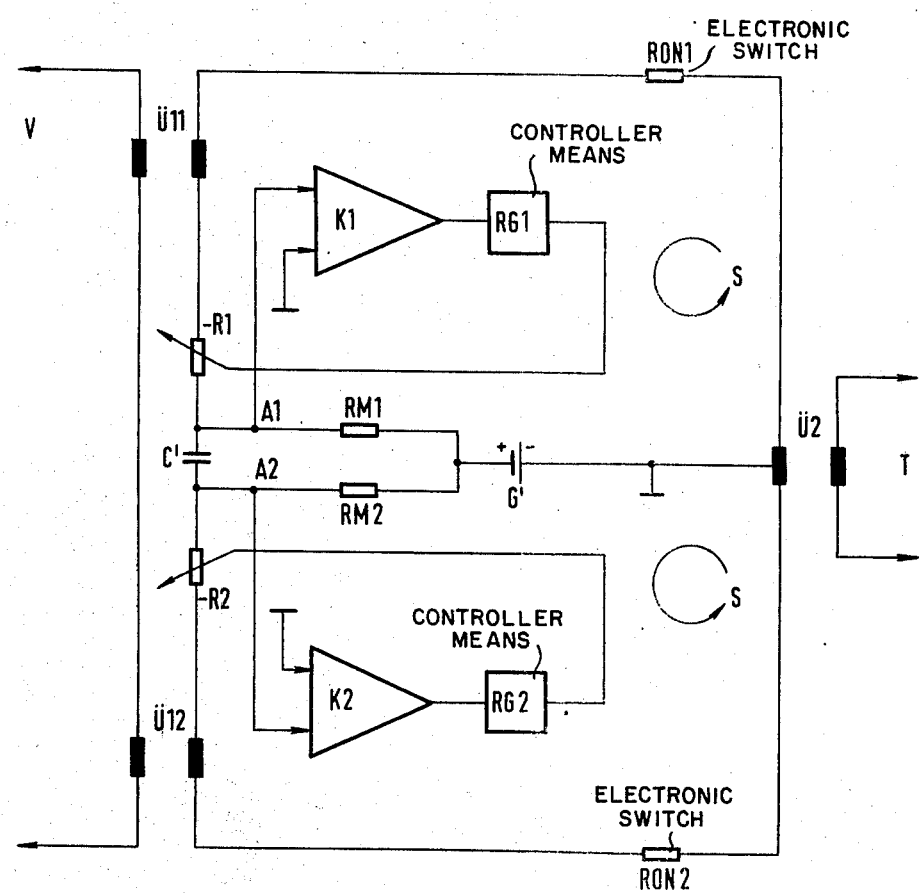
FIG. 2 is a schematic representation of one embodiment of a circuit arrangement for reversing the damping of a switching element in an exchange with a symmetrical switching grid.
Figure 3:
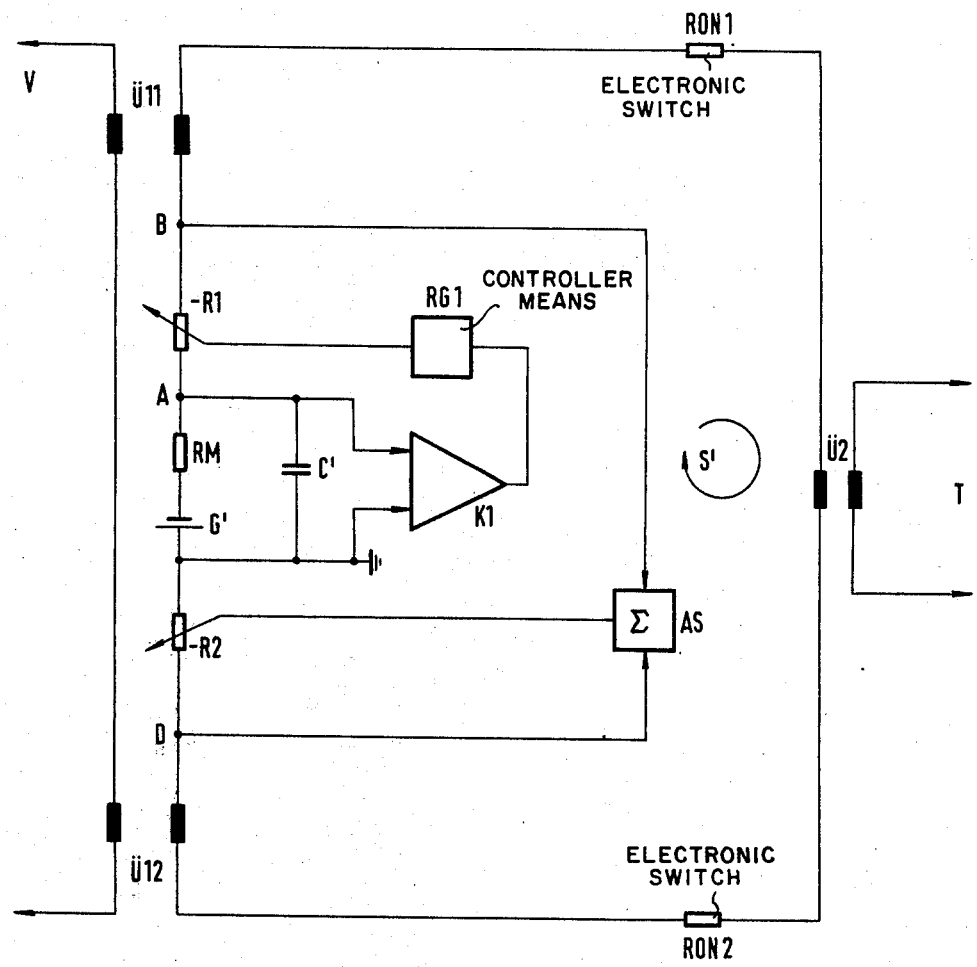
FIG. 3 is a schematic representation of a circuit arrangement for reversing the damping of a switching element in an exchange with a symmetrical switching grid.

FIG. 3 shows another preferred embodiment of the invention. Unlike the embodiment of FIG. 2, the dc voltage source G' is included in the circuit so there is only one circuit S' for the measuring current instead of two circuits S. A further difference lies in the method of control used.

To control a negative resistance, here −R1, the comparator circuit K1 and the controller RG1 are used as before. They adjust the negative resistance −R1 so that the potential at the point A disappears. This is not, however, achieved independently of the control of the other negative resistance. To meet symmetry requirements, the two negative resistances must have the same resistance value in case of alignment. The second resistance −R2 is, therefore, controlled by an analog circuit AS which is connected in parallel with the two negative resistances. The resistances have exactly the same value if, for example, the (positive) potential at the point B is equal in magnitude to the (negative) potential at the point D.

The analog circuit AS adds these two potentials and adjusts the negative resistance −R2 so that the potential sum disappears. Through the interplay of these two control actions, besides the compensation of the switching elements RON1 and RON2, full compliance with all symmetry requirements irrespective of any component variations is achieved; this has the advantage that the circuit is largely free from distortion.

Figure 5:
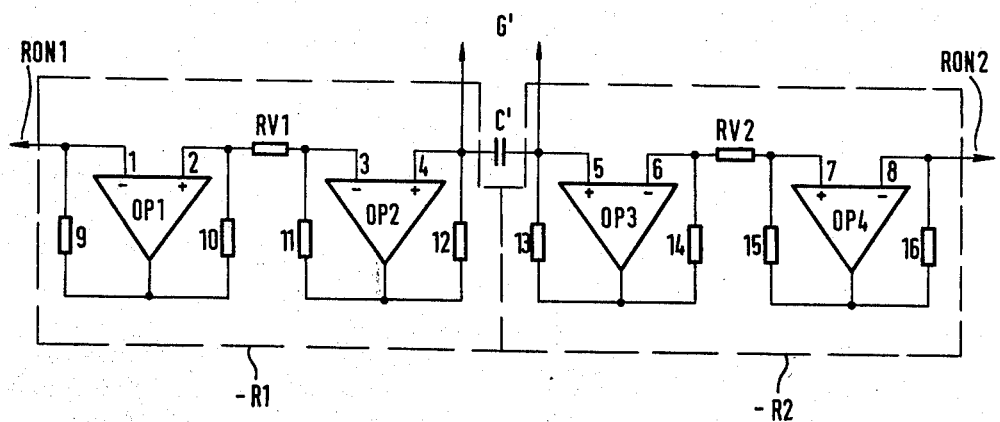
FIG. 5 is a schematic representation of the negative resistances $-R_1$ and $-R_2$ of FIGS. 2 and 3.

FIG. 5 shows a circuit arrangement which can be used in conjunction with the circuit arrangement according to the invention. The two resistances −R1 and −R2, constructed according to FIG. 3, are interconnected at their short-circuit-stable sides via the capacitor C'.

It should be noted that the secondary losses of the transformers shown in FIGS. 1 and 2 are automatically compensated for, and that the primary losses can be compensated for by choosing the value of the negative resistance to be higher by a certain amount, independently of the control.

While we have described above the principles of our invention in connection with specific apparatus it is to be clearly understood that this description is made only by way of example and not as a limitation to the scope of my invention as set forth in the objects thereof and in the accompanying claims.

What is claimed is:

1. A circuit arrangement for reversing the damping of electronic switches having linear current voltage characteristics comprising:
    current input means for coupling current into said arrangement;
    an electronic switch;
    a controllable negative resistance;
    a series resistor;
    a dc voltage source, said electronic switch, said controllable resistance, said series resistor, and said dc source are connected in series, so that current is coupled in and out of said arrangement on both sides of said electronic switch, said series resistor and dc source are shunted by a capacitor to provide alternate current transfer, and a comparator circuit provides measurement for a voltage drop across said dc source and said resistor for transmitting said voltage drop to a controller whereby said controller adjusts said negative resistance in order to cause said voltage drop to disappear; and
    current output means for coupling current out of said arrangement.

2. A arrangement for reversing the damping of electronic switches having linear current voltage characteristics comprising:
    current input means for coupling current into said arrangement;
    an electronic switch;
    a controllable negative resistance;
    a series resistor;
    a dc voltage source, said electronic switch, said controllable resistance, said series resistor, and said dc source are connected in series, so that current is coupled in and out of said arrangement on both sides of said electronic switch, said series resistor and dc source are shunted by a capacitor to provide alternate current transfer, and a comparator circuit provides measurement for a voltage drop across said dc source and said resistor for transmitting said voltage drop to a controller whereby said controller adjusts said negative resistance in order to cause said voltage drop to disappear;
    wherein said negative resistance comprises two operational amplifiers having a plurality of inputs coupled with a respective plurality of outputs by means of a plurality of feedback resistances so that said electronic switch is coupled to an inverting input of a first operational amplifier, and a non-inverting input of said first operational amplifier is coupled to an inverting input of a second operational amplifier by means of a resistor, and a non-inverting input of said second operational amplifier is connected to said series resistor; and
    current output means for coupling current out of said arrangement.

3. The arrangement of claim 1 including a pair of circuits fed from a common dc voltage source wherein said pair of circuits include a pair of switching elements and a pair of negative resistances, said switching elements and negative resistances being controllable independently of each other by means of a pair of comparator circuits and a pair of control elements.

4. The arrangement of claim 2, including a pair of circuits fed from a common dc voltage source wherein said pair of circuits include a pair of switching elements and a pair of negative resistances, said switching elements and negative resistances being controllable independently of each other by means of a pair of comparator circuits and a pair of control elements, wherein said dc voltage source and series resistor are connected between said pair of negative resistances so that only one of said negative resistances is controllable by an associated comparator circuit and controller, while said other negative resistance is controllable by an analog circuit connected in parallel with said pair of negative resistances, said dc voltage source, and said series resistor, for adding potential supply thereto and adjusting the other of said negative resistances so that the sum of said potentials is caused to disappear.

5. The arrangement of claim 4 wherein said two negative resistances further include four operational amplifiers coupled in series relative to each output of said four operational amplifiers, an output of each of said four operational amplifiers is coupled to two inputs of each amplifier by means of a resistor; and whereby said inverting input of said first operational amplifier is connected to said associated switching element, said non-inverting input of said first operational amplifier is connected via a first resistor to said inverting input of said second operational amplifier, said non-inverting input of said second operational amplifier and said non-inverting input of said third operational amplifier are interconnected via said capacitor and serve to connect said dc voltage source, said inverting input of said third operational amplifier is connected via a second resistor to said non-inverting input of said fourth operational amplifier and said inverting input of said fourth operational amplifier is connected to said associated switching element.

6. The arrangement of claim 3 wherein all of said elements provided for reversing the damping of a switching element are arranged centrally on that side of the switching elements which faces the inputs.

* * * * *